(12) United States Patent
Hsieh et al.

(10) Patent No.: US 11,166,371 B2
(45) Date of Patent: Nov. 2, 2021

(54) ELECTRONIC DEVICE AND MAINBOARD AND SYSTEM IN PACKAGE MODULE THEREOF

(71) Applicant: Wistron NeWeb Corp., Hsinchu (TW)

(72) Inventors: Chen-An Hsieh, Hsinchu (TW); Jui-Hua Hu, Hsinchu (TW); Shih-Wei Chang, Hsinchu (TW)

(73) Assignee: WISTRON NEWEB CORP., Hsinchu (TW)

( * ) Notice: Subject to any disclaimer, the term of this patent is extended or adjusted under 35 U.S.C. 154(b) by 58 days.

(21) Appl. No.: 16/822,305

(22) Filed: Mar. 18, 2020

(65) Prior Publication Data
US 2021/0084759 A1   Mar. 18, 2021

(30) Foreign Application Priority Data
Sep. 12, 2019 (TW) ................. 108132937

(51) Int. Cl.
| H05K 7/00 | (2006.01) |
| H05K 1/11 | (2006.01) |
| H05K 1/18 | (2006.01) |
| H01R 12/58 | (2011.01) |

(52) U.S. Cl.
CPC ............ *H05K 1/11* (2013.01); *H01R 12/58* (2013.01); *H05K 1/181* (2013.01); *H05K 2201/10325* (2013.01)

(58) Field of Classification Search
CPC ........... H05K 1/11; H05K 1/181; H01R 12/58

USPC ......................................... 361/777
See application file for complete search history.

(56) References Cited

U.S. PATENT DOCUMENTS

| 7,372,169 B2 | 5/2008 | Chang | |
| 2003/0123818 A1* | 7/2003 | Watanabe | H05K 1/141 385/92 |
| 2007/0080456 A1* | 4/2007 | Chang | H01L 23/49816 257/738 |
| 2020/0108459 A1* | 4/2020 | Lee | H05K 3/3436 |

FOREIGN PATENT DOCUMENTS

| CN | 2879422 Y | 3/2007 |
| CN | 205622982 U | 10/2016 |

* cited by examiner

*Primary Examiner* — Andargie M Aychillhum
(74) *Attorney, Agent, or Firm* — McClure, Qualey & Rodack, LLP (57) ABSTRACT

A system package module is provided. The system package module includes a module substrate, a plurality of first pins and a plurality of second pins. The module substrate includes a module substrate surface. The module substrate surface includes a first pin arrangement area and a second pin arrangement area. The second pin arrangement area surrounds the first pin arrangement area. The first pins are disposed in the first pin arrangement area. A first pin gap is formed between the two adjacent first pins. The second pins are disposed in the second pin arrangement area. A second pin gap is formed between the two adjacent second pins. The first pin gap is greater than the second pin gap.

11 Claims, 9 Drawing Sheets

ELECTRONIC DEVICE AND MAINBOARD AND SYSTEM IN PACKAGE MODULE THEREOF

CROSS REFERENCE TO RELATED APPLICATIONS

This application claims priority of Taiwan Patent Application No. 108132937, filed on Sep. 12, 2019, the entirety of which is incorporated by reference herein.

BACKGROUND OF THE INVENTION

Field of the Invention

The present invention relates to a system package module and a mainboard, and in particular to a system package module and a mainboard with improved compatibility.

Description of the Related Art

The pin design of the conventional system package module and the contact design of the mainboard corresponding thereto are based on the requirements on the particular product. The one single mainboard cannot be compatible with differently designed system package modules. The production costs of the electronic products are therefore increased.

BRIEF SUMMARY OF THE INVENTION

In one embodiment, a system package module is provided. The system package module includes a module substrate, a plurality of first pins and a plurality of second pins. The module substrate comprises a module substrate surface. The module substrate surface comprises a first pin arrangement area and a second pin arrangement area. The second pin arrangement area surrounds the first pin arrangement area. The first pins are disposed in the first pin arrangement area. A first pin gap is formed between the two adjacent first pins. The second pins are disposed in the second pin arrangement area. A second pin gap is formed between the two adjacent second pins. The first pin gap is greater than the second pin gap.

In one embodiment, a mainboard is provided. The mainboard includes a mainboard substrate, a plurality of first contacts and a plurality of second contacts. The mainboard substrate comprises a mainboard substrate surface, the mainboard substrate surface comprises a first contact arrangement area and a second contact arrangement area, and the second contact arrangement area surrounds the first contact arrangement area. The first contacts are disposed in the first contact arrangement area, and a first contact gap is formed between the two adjacent first contacts. The second contacts are disposed in the second contact arrangement area, a second contact gap is formed between the two adjacent second contacts, and the first contact gap is greater than the second contact gap.

In one embodiment, an electronic device is provided. The electronic device selectively comprises a first system package module or a second system package module. The electronic device further comprises a mainboard. The mainboard comprises a mainboard substrate, a plurality of first contacts, and a plurality of second contacts. The mainboard substrate comprises a mainboard substrate surface. The mainboard substrate surface comprises a first contact arrangement area and a second contact arrangement area. The second contact arrangement area surrounds the first contact arrangement area. The first contacts are disposed in the first contact arrangement area. A first contact gap is formed between the two adjacent first contacts. The second contacts are disposed in the second contact arrangement area. A second contact gap is formed between the two adjacent second contacts. The first contact gap is greater than the second contact gap. The first system package module is smaller than the second system package module.

Utilizing the electronic device of the embodiment of the invention, one single mainboard can be compatible with different system package modules (for example, the first system package module and the second system package module). The manufacturing cost of the electronic device can be decreased. Additionally, in the embodiment of the invention, the second pin arrangement area surrounds around the first pin arrangement area. The first pin gap is greater than the second pin gap. The second pins (outer pins) are arranged densely, and provide improved strength and reliability.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
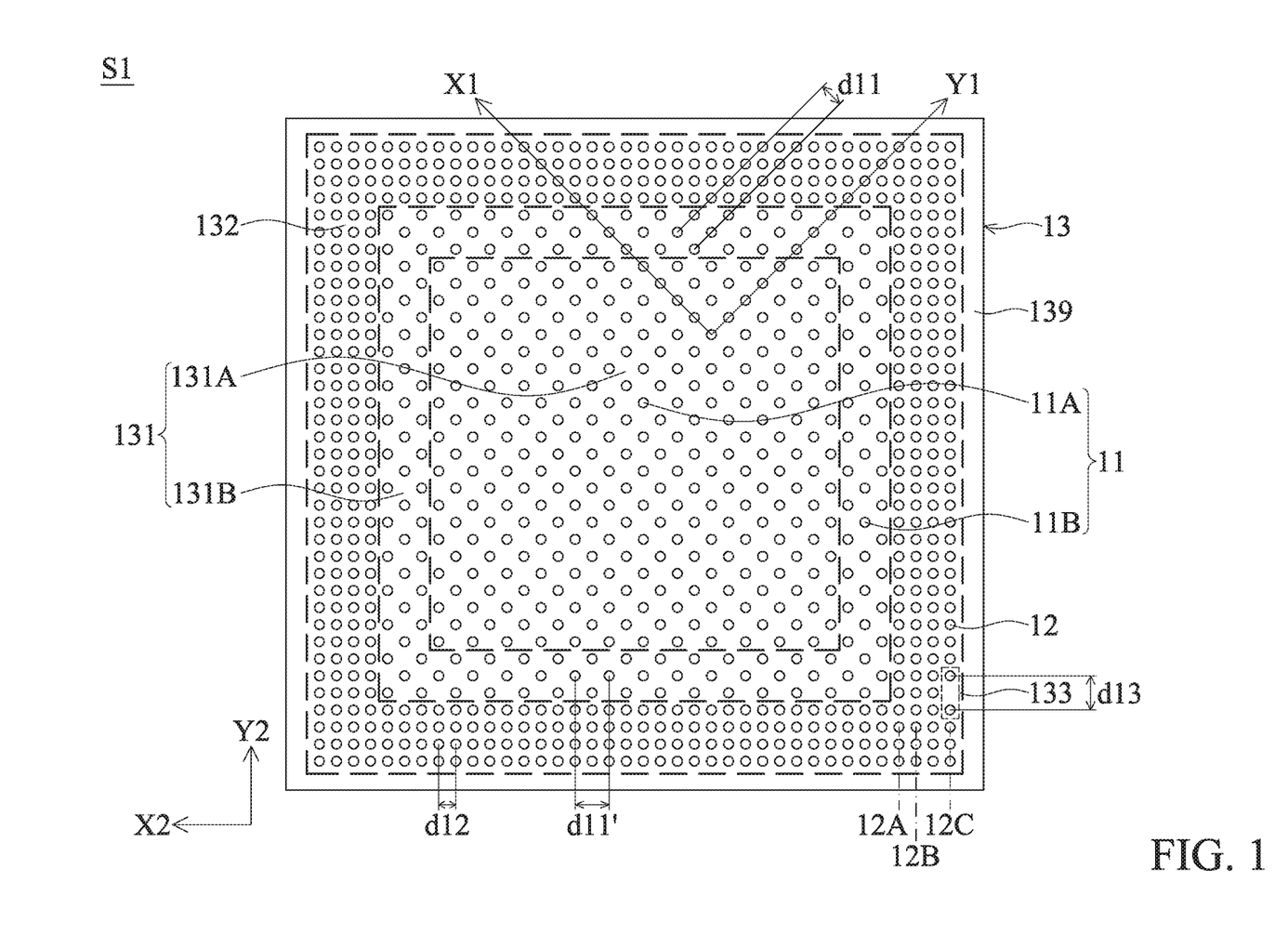
FIG. 1 shows a system package module (first system package module) of the embodiment of the invention.

FIG. 1 shows a system package module (first system package module) S1 of the embodiment of the invention. With reference to FIG. 1, the system package module (first system package module) S1 includes a module substrate (first module substrate) 13, a plurality of first pins 11 and a plurality of second pins 12. The module substrate 13 comprises a module substrate surface (first module substrate surface) 139. The module substrate surface 139 comprises a first pin arrangement area 131 and a second pin arrangement area 132. The second pin arrangement area 132 surrounds the first pin arrangement area 131. The first pins 11 are disposed in the first pin arrangement area 131. A first pin gap d11 is formed between the two adjacent first pins 11. The second pins 12 are disposed in the second pin arrangement area 132. A second pin gap d12 is formed between the two adjacent second pins 12. The first pin gap d11 is greater than the second pin gap d12.

In one embodiment, the proportion of the first pin gap d11 to the second pin gap d12 is 1.05:1.

Figure 2A:
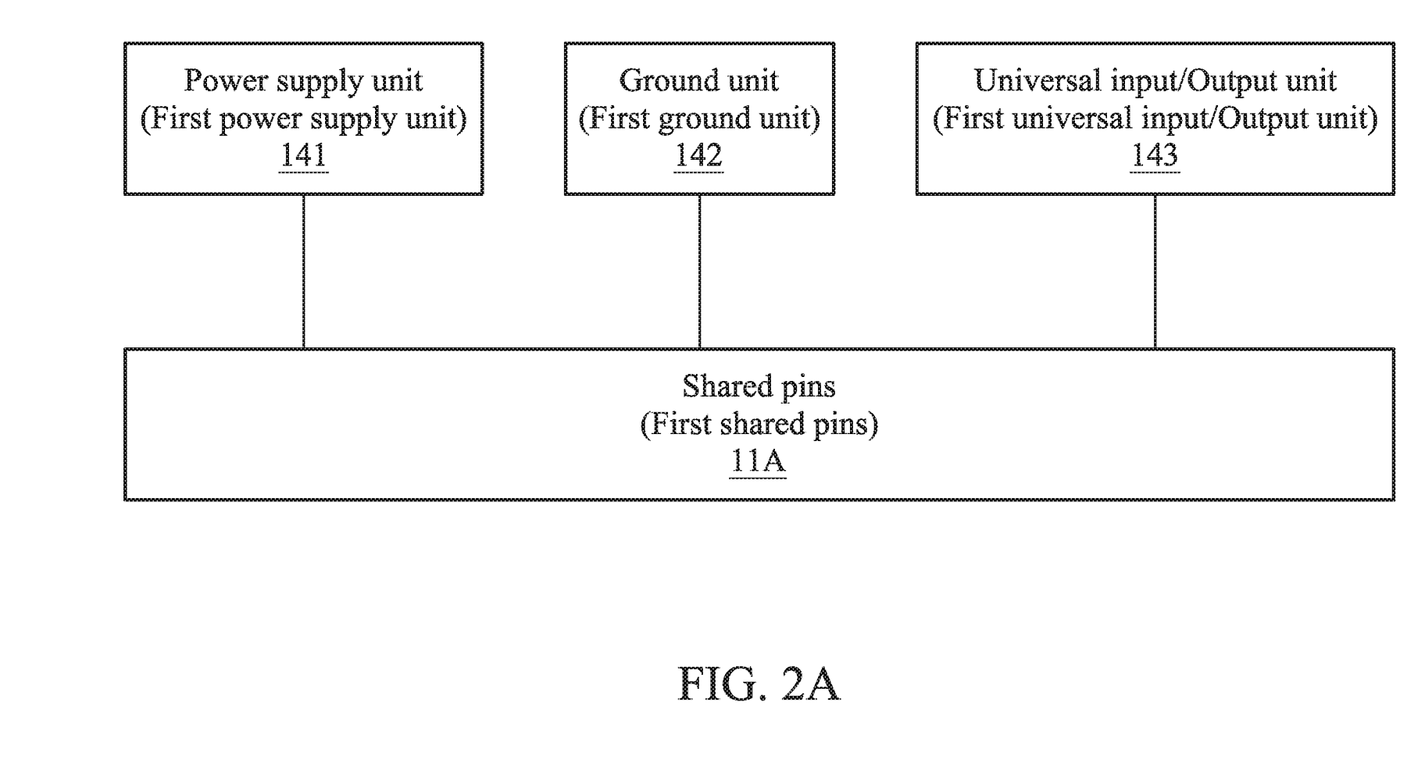
FIG. 2A is a block diagram of some of the elements of the system package module (first system package module) of the embodiment of the invention.

FIG. 2A is a block diagram of some of the elements of the system package module S1 of the embodiment of the invention. With reference to FIGS. 1 and 2A, in one embodiment, the system package module S1 further comprises a power supply unit (first power supply unit) 141, a ground unit (first ground unit) 142 and a universal input/output unit (first universal input/output unit) 143. The first pin arrangement area 131 comprises a shared area (first shared area) 131A and a non-shared area (first non-shared area) 131B. The non-shared area 131B surrounds the shared area 131A. With reference to FIG. 1, the first pins 11 comprise a plurality of shared pins (first shared pins) 11A and a plurality of non-shared pins (first non-shared pins) 11B. The shared pins 11A are disposed in the shared area 131A. The non-shared pins 11B are disposed in the non-shared area 131B. The shared pins 11A are coupled to the power supply unit 141, the ground unit 142 and the universal input/output unit 143.

Figure 2B:
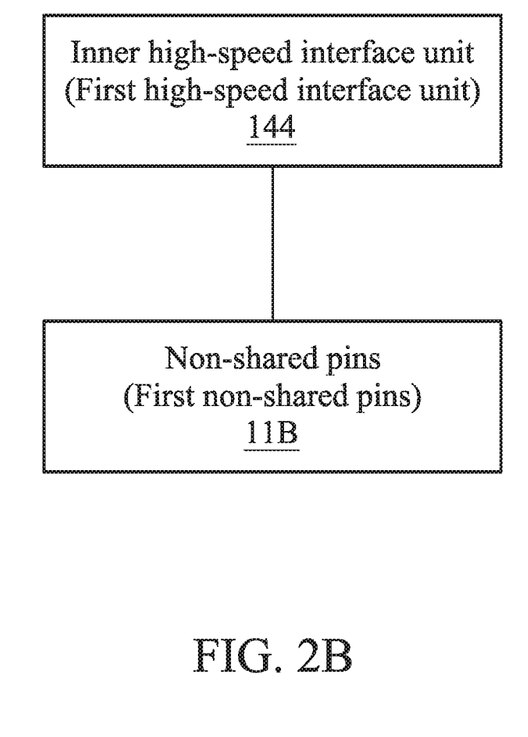
FIG. 2B is a block diagram of some other elements of the system package module (first system package module) of the embodiment of the invention.

FIG. 2B is a block diagram of some other elements of the system package module S1 of the embodiment of the invention. With reference to FIG. 2B, in one embodiment, the system package module further comprises an inner high-speed interface unit (first high-speed interface unit) 144, and the inner high-speed interface unit 144 is coupled to the non-shared pins 11B.

Figure 2C:
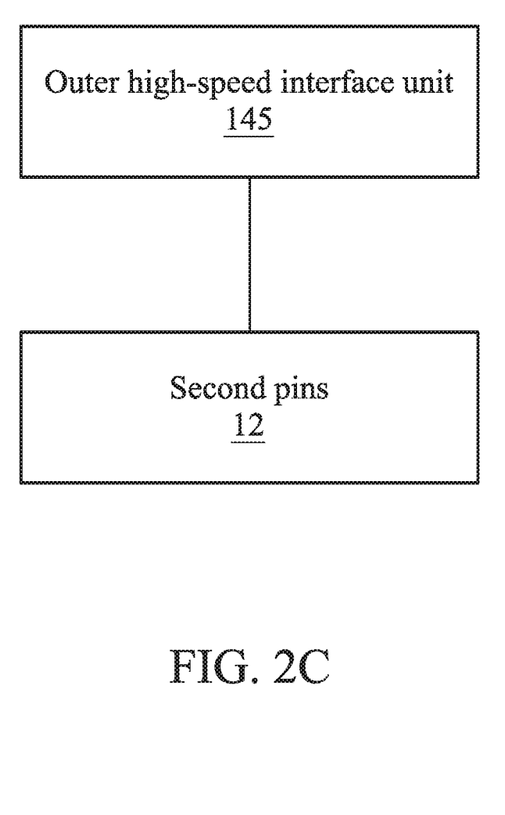
FIG. 2C is a block diagram of some other elements of the system package module (first system package module) of the embodiment of the invention.

FIG. 2C is a block diagram of some other elements of the system package module S1 of the embodiment of the invention. With reference to FIG. 2C, in one embodiment, the system package module S1 further comprises an outer high-speed interface unit 145, wherein the inner high-speed interface unit 145 is coupled to at least a portion of the second pins 12, and the outer high-speed interface unit 145 differs from the inner high-speed interface unit 144. In one embodiment, the inner high-speed interface unit 144 can includes the second generation PCIE interface and the third generation PCIE interface. The outer high-speed interface unit 145 includes the fourth generation PCIE interface.

With reference to FIG. 1, in one embodiment, the first pins 11 are arranged in a matrix along a first axis X1 and a second axis Y1. The first axis X1 is perpendicular to the second axis Y1. The second pins 12 are arranged in a matrix along a third axis X2 and a fourth axis Y2. The third axis X2 is perpendicular to the fourth axis Y2. The included angle between the first axis X1 and the third axis X2 is 45 degrees.

In one embodiment, the first pin gap d11 can be 1.79 mm. The second pin gap d12 can be 1.27 mm. In the coordination defined by the third axis X2 and the fourth axis Y2, a pin gap d11' is formed between the adjacent first pins 11, and the pin gap d11' can be 2.54 mm. The disclosure is not meant to restrict the invention.

With reference to FIG. 1, in one embodiment, the second pin arrangement area 132 comprises a module recognition area (first module recognition area) 133. In the module recognition area 133, a recognition gap (first recognition gap) d13 is formed between the adjacent second pins 12, and the recognition gap d13 is greater than the second pin gap d12.

With reference to FIG. 1, in one embodiment, the second pins 12 comprises a first pin row 12A, a second pin row 12B and a third pin row 12C. The second pin row 12B is located between the first pin row 12A and the third pin row 12C. The module recognition area 133 can be located on the first pin row 12A, the second pin row 12B or the third pin row 12C. In one embodiment, the first pin row 12A is adjacent to the first pin arrangement area 131. The third pin row 12C is located on the outer edge of the second pin arrangement area 132. In this embodiment, the module recognition area 133 is on the third pin row 12C.

Figure 3:
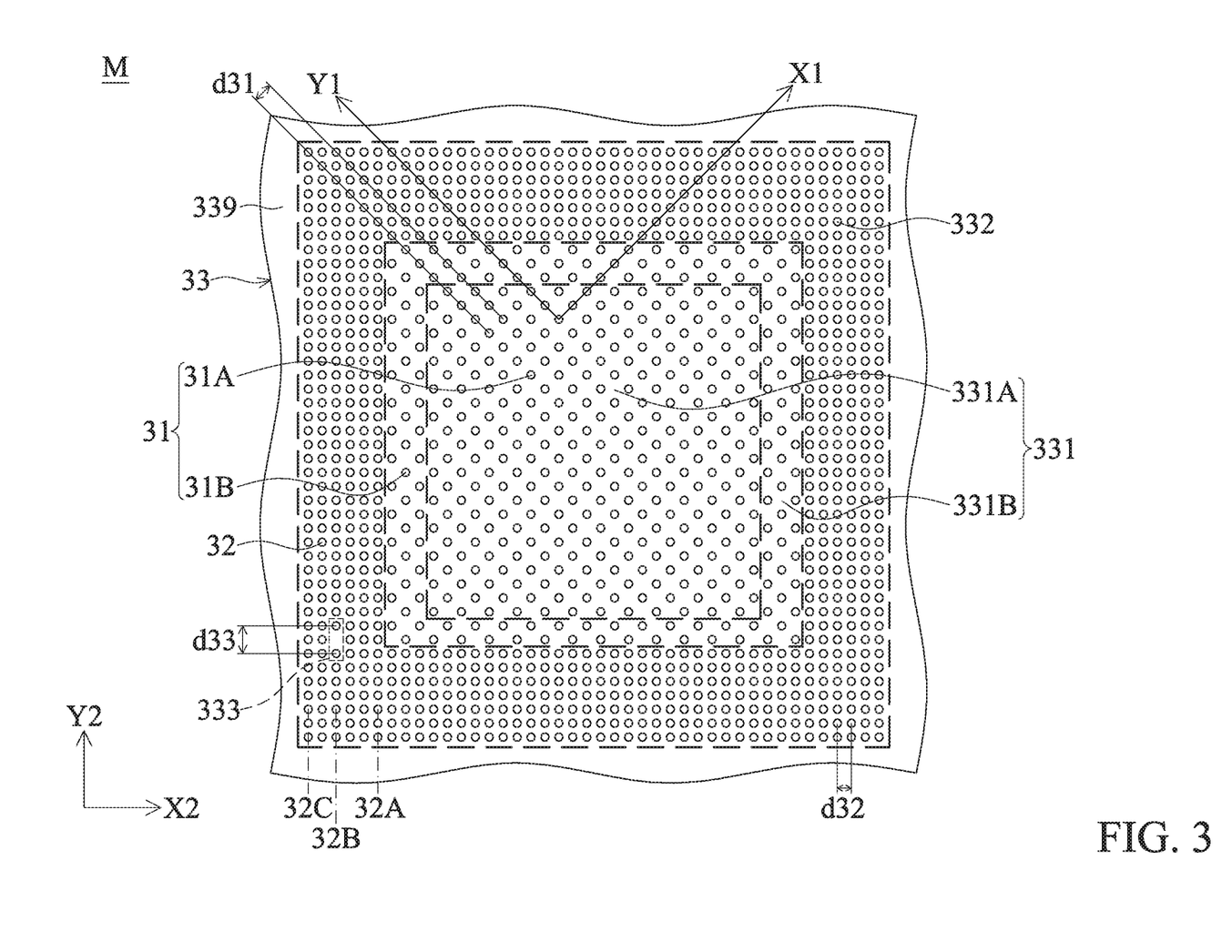
FIG. 3 shows a mainboard of the embodiment of the invention.

With reference to FIG. 3, in one embodiment, a mainboard M of the embodiment of the invention is provided. The mainboard M includes a mainboard substrate 33, a plurality of first contacts 31 and a plurality of second contacts 32. The mainboard substrate 33 comprises a mainboard substrate surface 339. The mainboard substrate surface 339 comprises a first contact arrangement area 331 and a second contact arrangement area 332. The second contact arrangement area 332 surrounds the first contact arrangement area 331. The first contacts 31 are disposed in the first contact arrangement area 331, and a first contact gap d31 is formed between the two adjacent first contacts 31. The second contacts 32 are disposed in the second contact arrangement area 332, a second contact gap d32 is formed between the two adjacent second contacts 32, and the first contact gap d31 is greater than the second contact gap d32.

With reference to FIG. 3, in one embodiment, the first contacts 31 are arranged in a matrix along a first axis X1 and a second axis Y1. The first axis X1 is perpendicular to the second axis Y1. The second contacts 32 are arranged in a matrix along a third axis X2 and a fourth axis Y2. The third axis X2 is perpendicular to the fourth axis Y2. The included angle between the first axis X1 and the third axis X2 is 45 degrees.

With reference to FIG. 3, in one embodiment, the second contact arrangement area 332 comprises a mainboard recognition area 333. In the mainboard recognition area 333, a third contact gap d33 is formed between the adjacent second contacts 32, and the third contact gap d33 is greater than the second contact gap d32.

In the embodiment of the invention, the mainboard recognition area 333 corresponds to the module recognition area 133. When the system package module S1 is assembled to the mainboard M, the mainboard recognition area 333 and the module recognition area 133 provide positioning function.

In one embodiment, the second contacts 32 comprise a first contact row 32A, a second contact row 32B and a third contact row 32C. The second contact row 32B is located between the first contact row 32A and the third contact row 32C. The mainboard recognition area 333 can be located on the first contact row 32A, the second contact row 32B or the third contact row 32C.

Figure 4:
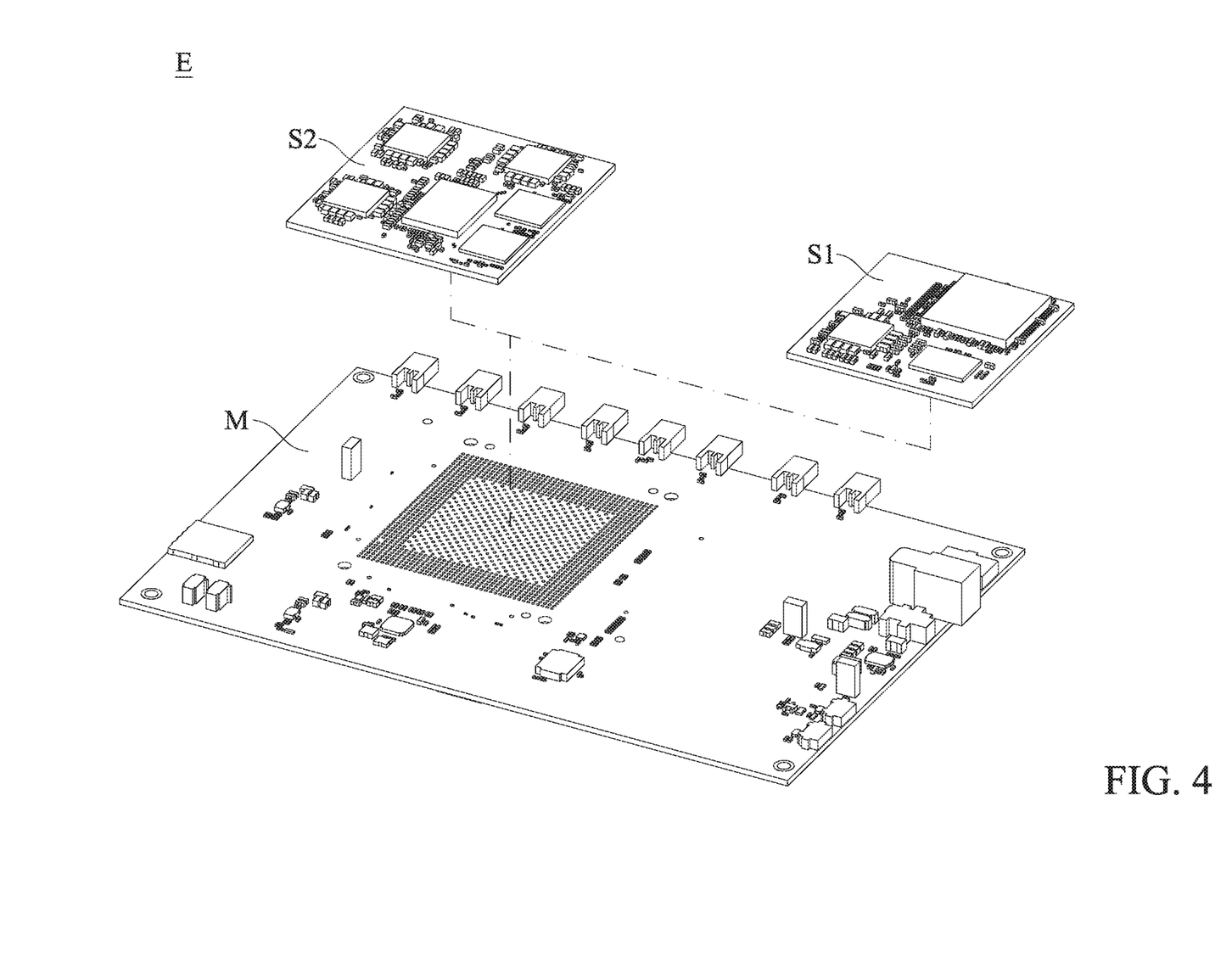
FIG. 4 shows an electronic device of the embodiment of the invention.

FIG. 4 shows an electronic device of the embodiment of the invention. With reference to FIG. 4, the electronic device E of the embodiment of the invention selectively comprises one of the first system package module S1 and a second system package module S2. The electronic device E further comprises the mainboard M. The first system package module S1 is smaller than the second system package module S2. In some embodiments, the size of first system package module S1 is same as the size of the second system package module S2.

In the embodiment of the invention, the details of the first system package module S1 has been mentioned above without further elaboration.

With reference to FIGS. 1, 3 and 4, in one embodiment, the first pins 11 of the first system package module S1 are adapted to be connected with the first contacts 31, and the second pins 12 are adapted to be connected with a portion of the second contacts 32.

Figure 5:
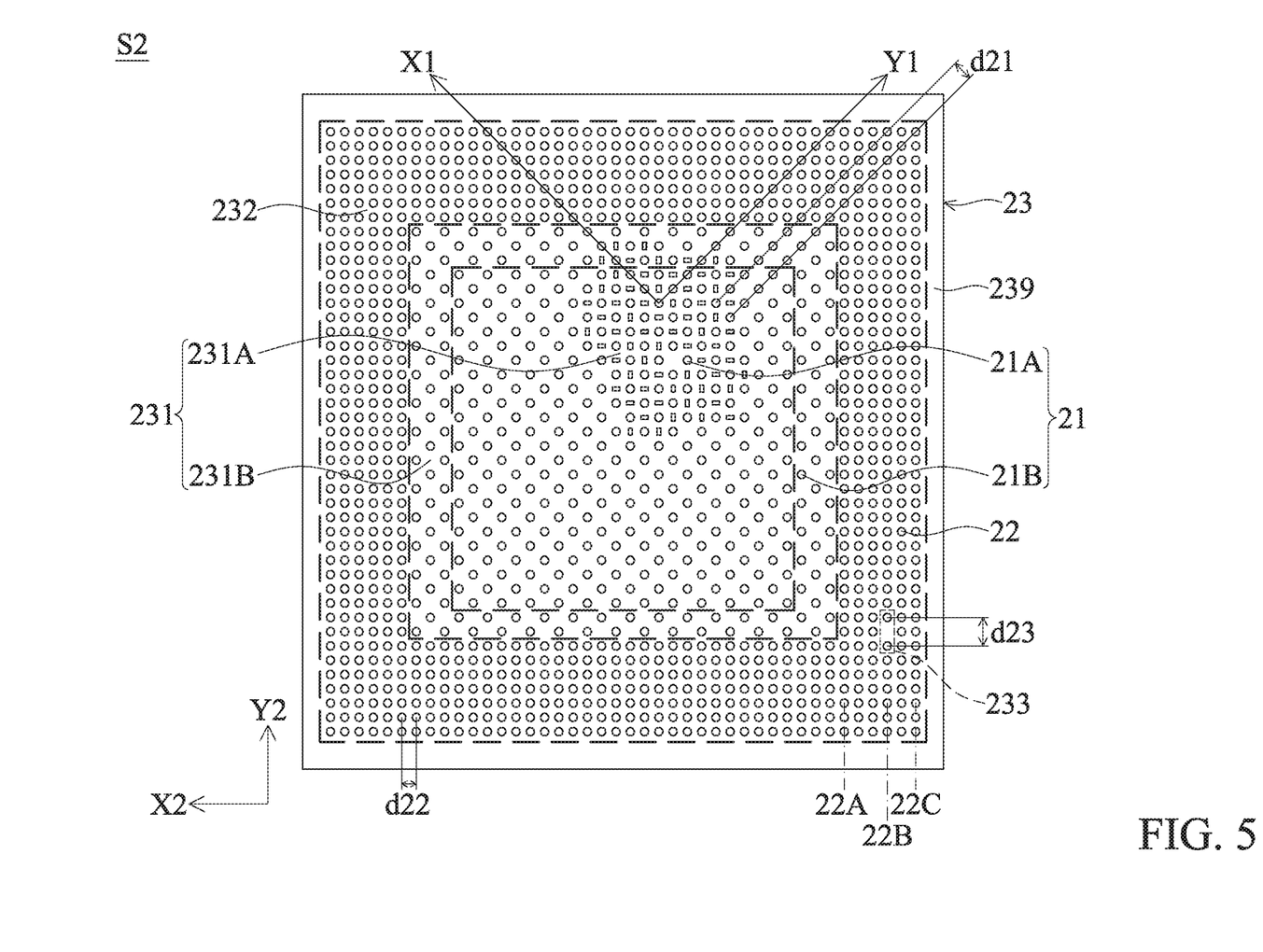
FIG. 5 shows details of a second system package module of the embodiment of the invention.

FIG. 5 shows details of a second system package module of the embodiment of the invention. With reference to FIG. 5, in this embodiment, the second system package module S2 comprises a second module substrate 23, a plurality of third pins 21 and a plurality of fourth pins 22. The second module substrate 23 comprises a second module substrate surface 239. The second module substrate surface 239 comprises a third pin arrangement area 231 and a fourth pin arrangement area 232. The fourth pin arrangement area 232 surrounds the third pin arrangement area 231. The third pins 21 are disposed in the third pin arrangement area 231, and a third pin gap d21 is formed between the two adjacent third pins 21. The fourth pins 22 are disposed in the fourth pin arrangement area 232, and a fourth pin gap d22 is formed between the two adjacent fourth pins 22. The third pin gap d21 is greater than the fourth pin gap d22. The third pins 21 are adapted to be connected with the first contacts 31, and the fourth pins 22 are adapted to be connected with at least a portion of the second contacts 32.

With reference to FIGS. 1 and 5, in one embodiment, the first pin arrangement area 131 is equal in size to the third pin arrangement area 231. The second pin arrangement area 132 is smaller than the fourth pin arrangement area 232.

In the embodiment of the invention, the size of the first contact arrangement area 331 of the mainboard M is equal to the size of the first pin arrangement area 131 of the first system package module S1. Similarly, the size of the first contact arrangement area 331 of the mainboard M is equal to the size of the third pin arrangement area 231 of the second system package module S2.

Figure 6A:
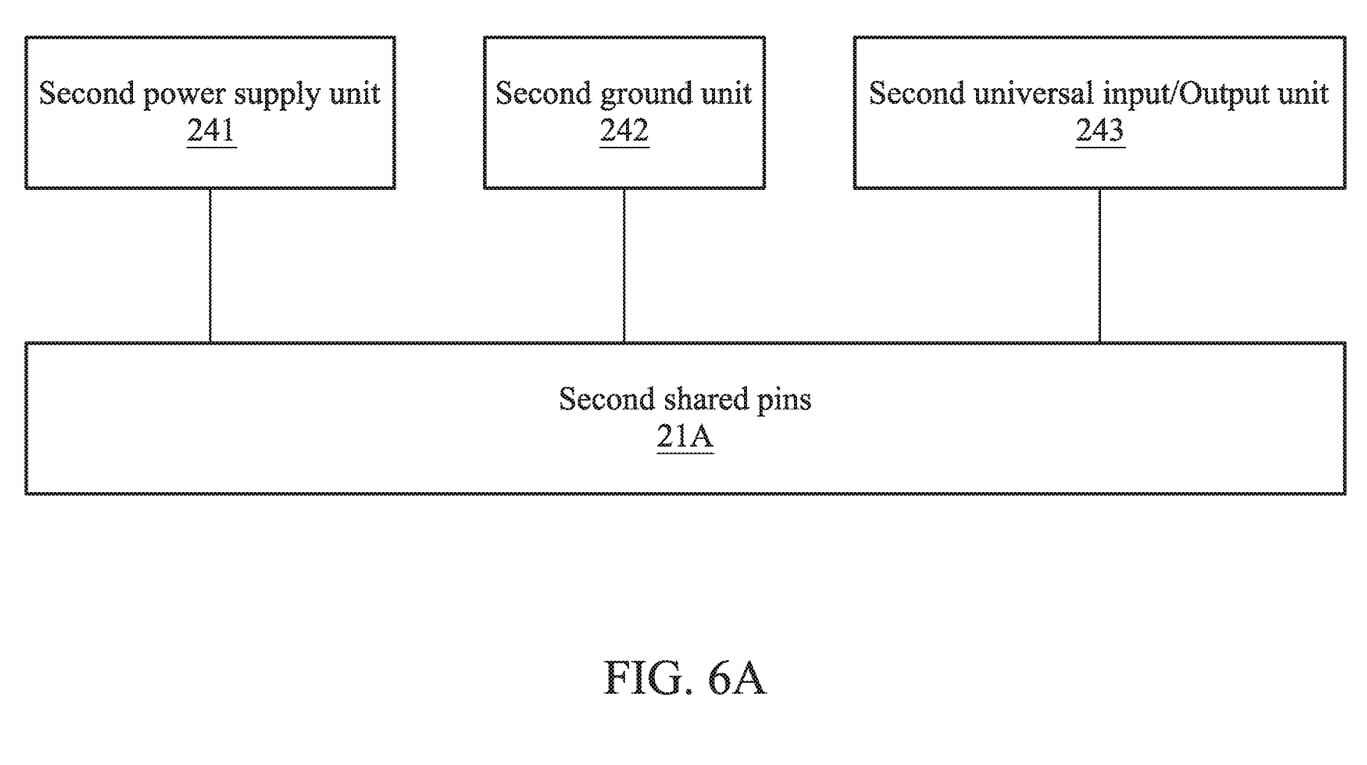
FIG. 6A is a block diagram of some of the elements of the second system package module of the embodiment of the invention.

FIG. 6A is a block diagram of some of the elements of the second system package module S2 of the embodiment of the invention. With reference to FIGS. 5 and 6A, in one embodiment, the second system package module S2 further comprises a second power supply unit 241, a second ground unit 242 and a second universal input/output unit 243. The third pin arrangement area 231 comprises a second shared area 231A and a second non-shared area 231B. The second non-shared area 231B surrounds the second shared area 231A. The third pins 21 comprise a plurality of second shared pins 21A and a plurality of second non-shared pins 21B. The second shared pins 21A are disposed in the second shared area 231A. The second non-shared pins 21B are disposed in the second non-shared area 231B. The second shared pins 21A are coupled to the second power supply unit 241, the second ground unit 242 and the second universal input/output unit 243.

With reference to FIG. 5, in one embodiment, the fourth pin arrangement area 232 comprises a second module recognition area 233. In the second module recognition area 233, a second recognition gap d23 is formed between the adjacent fourth pins 22, and the second recognition gap d23 is greater than the fourth pin gap d22.

With reference to FIG. 5, in one embodiment, the fourth pins 22 comprises a fourth pin row 22A, a fifth pin row 22B and a sixth pin row 22C. The fifth pin row 22B is located between the fourth pin row 22A and the sixth pin row 22C. The second module recognition area 233 can be located on the fourth pin row 22A, the fifth pin row 22B or the sixth pin row 22C. In this embodiment, the second module recognition area 233 is on the fifth pin row 22B.

Figure 6B:
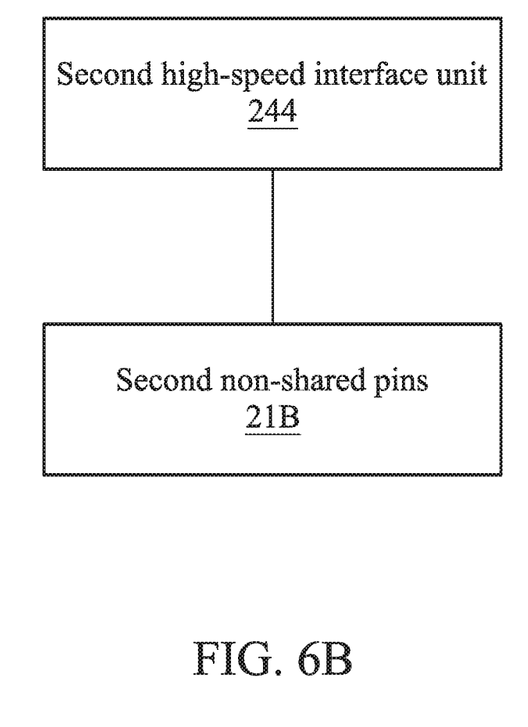
FIG. 6B is a block diagram of some other elements of the second system package module of the embodiment of the invention.

With reference to FIGS. 2B and 6B, in one embodiment, the first system package module S1 further comprises a first high-speed interface unit 144. The first high-speed interface unit 144 is coupled to the first non-shared pins 11B. The first high-speed interface unit 114 comprises a first number of channels. The second system package module S2 further comprises a second high-speed interface unit 244. The second high-speed interface unit 244 is coupled to the second non-shared pins 21B. The second high-speed interface unit 244 comprises a second number of channels. There are more second interface channels than first interface channels.

With reference to FIG. 1, in one embodiment, the shared area (first shared area) 131A and/or the non-shared area (first non-shared area) 131B can include blank area. The disclosure is not meant to restrict the invention.

With reference to FIG. 5, in one embodiment, passive elements can be disposed between the fourth pins 21 in the third pin arrangement area 231. The disclosure is not meant to restrict the invention.

Utilizing the electronic device of the embodiment of the invention, one single mainboard can be compatible with different system package modules (for example, the first system package module and the second system package module). The manufacturing cost of the electronic device can be decreased. Additionally, in the embodiment of the invention, the second pin arrangement area surrounds around the first pin arrangement area. The first pin gap is greater than the second pin gap. The second pins (outer pins) are arranged densely, and provide improved strength and reliability.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A system package module, comprising:
   a module substrate, wherein the module substrate comprises a module substrate surface, the module substrate surface comprises a first pin arrangement area and a second pin arrangement area, and the second pin arrangement area surrounds the first pin arrangement area;
   a plurality of first pins, wherein the first pins are disposed in the first pin arrangement area, and a first pin gap is formed between two adjacent first pins;
   a plurality of second pins, wherein the second pins are disposed in the second pin arrangement area, a second pin gap is formed between two adjacent second pins, and the first pin gap is greater than the second pin gap;
a power supply unit;
a ground unit;
a universal input/output unit, the first pin arrangement area comprises a shared area and a non-shared area, the non-shared area surrounds the shared area, the first pins comprise a plurality of shared pins and a plurality of non-shared pins, the shared pins are disposed in the shared area, the non-shared pins are disposed in the non-shared area, and the shared pins are coupled to the power supply unit, the ground unit and the universal input/output unit;
an inner high-speed interface unit, wherein the inner high-speed interface unit is coupled to the non-shared pins; and
an outer high-speed interface unit, wherein the outer high-speed interface unit is coupled to at least a portion of the second pins, and the outer high-speed interface unit differs from the inner high-speed interface unit.

2. The system package module as claimed in claim 1, wherein a proportion of the first pin gap to the second pin gap is 1.05:1.

3. The system package module as claimed in claim 1, wherein the first pins are arranged in a matrix along a first axis and a second axis, wherein the first axis is perpendicular to the second axis, the second pins are arranged in a matrix along a third axis and a fourth axis, wherein the third axis is perpendicular to the fourth axis, and an included angle between the first axis and the third axis is 45 degrees.

4. The system package module as claimed in claim 1, wherein the second pin arrangement area comprises a module recognition area, in the module recognition area, a recognition gap is formed between the adjacent second pins, and the recognition gap is greater than the second pin gap.

5. The system package module as claimed in claim 4, wherein the second pins comprise a first pin row, a second pin row and a third pin row, the second pin row is located between the first pin row and the third pin row, and the module recognition area is located on the first pin row, the second pin row or the third pin row.

6. An electronic device, selectively comprising a first system package module or a second system package module, further comprising:
a mainboard, comprising a mainboard substrate, a plurality of first contacts and a plurality of second contacts, wherein the mainboard substrate comprises a mainboard substrate surface, the mainboard substrate surface comprises a first contact arrangement area and a second contact arrangement area, the second contact arrangement area surrounds the first contact arrangement area, the first contacts are disposed in the first contact arrangement area, a first contact gap is formed between two adjacent first contacts, the second contacts are disposed in the second contact arrangement area, a second contact gap is formed between two adjacent second contacts, and the first contact gap is greater than the second contact gap,
wherein the first system package module comprises:
a first module substrate, wherein the first module substrate comprises a first module substrate surface, the first module substrate surface comprises a first pin arrangement area and a second pin arrangement area, and the second pin arrangement area surrounds the first pin arrangement area;
a plurality of first pins, wherein the first pins are disposed in the first pin arrangement area, and a first pin gap is formed between two adjacent first pins; and
a plurality of second pins, wherein the second pins are disposed in the second pin arrangement area, a second pin gap is formed between two adjacent second pins, and the first pin gap is greater than the second pin gap, wherein the first pins are adapted to be connected with the first contacts, and the second pins are adapted to be connected with a portion of the second contacts,
wherein the second system package module comprises:
a second module substrate, wherein the second module substrate comprises a second module substrate surface, the second module substrate surface comprises a third pin arrangement area and a fourth pin arrangement area, and the fourth pin arrangement area surrounds the third pin arrangement area;
a plurality of third pins, wherein the third pins are disposed in the third pin arrangement area, and a third pin gap is formed between two adjacent third pins; and
a plurality of fourth pins, wherein the fourth pins are disposed in the fourth pin arrangement area, a fourth pin gap is formed between two adjacent fourth pins, and the third pin gap is greater than the fourth pin gap, wherein the third pins are adapted to be connected with the first contacts, and the fourth pins are adapted to be connected with at least a portion of the second contacts.

7. The electronic device as claimed in claim 6, wherein the first pin arrangement area is equal in size to the third pin arrangement area.

8. The electronic device as claimed in claim 7, wherein the first system package module is smaller than the second system package module, wherein the second pin arrangement area is smaller than the fourth pin arrangement area.

9. The electronic device as claimed in claim 8, wherein the first system package module further comprises a first power supply unit, a first ground unit, and a first universal input/output unit, the first pin arrangement area comprises a first shared area and a first non-shared area, the first non-shared area surrounds the first shared area, the first pins comprise a plurality of first shared pins and a plurality of first non-shared pins, the first shared pins are disposed in the first shared area, the first non-shared pins are disposed in the first non-shared area, and the first shared pins are coupled to the first power supply unit, the first ground unit and the first universal input/output unit.

10. The electronic device as claimed in claim 9, wherein the second system package module further comprises a second power supply unit, a second ground unit and a second universal input/output unit, the third pin arrangement area comprises a second shared area and a second non-shared area, the second non-shared area surrounds the second shared area, the third pins comprise a plurality of second shared pins and a plurality of second non-shared pins, the second shared pins are disposed in the second shared area, the second non-shared pins are disposed in the second non-shared area, and the second shared pins are coupled to the second power supply unit, the second ground unit and the second universal input/output unit.

11. The electronic device as claimed in claim 10, wherein the first system package module further comprises a first high-speed interface unit, the first high-speed interface unit is coupled to the first non-shared pins, the first high-speed interface unit comprises a first number of channels, the second system package module further comprises a second high-speed interface unit, the second high-speed interface unit is coupled to the second non-shared pins, the second high-speed interface unit comprises a second number of channels, and there are more second interface channels than first interface channels.

* * * * *